United States Patent [19]
Yehushua et al.

[11] Patent Number: 5,369,671
[45] Date of Patent: Nov. 29, 1994

[54] SYSTEM AND METHOD FOR DECODING TAIL-BITING CODE ESPECIALLY APPLICABLE TO DIGITAL CELLULAR BASE STATIONS AND MOBILE UNITS

[75] Inventors: Moshe Yehushua, San Diego; John Watson, Carlsbad; Michael Parr, San Diego, all of Calif.

[73] Assignee: Hughes Aircraft Company, Los Angeles, Calif.

[21] Appl. No.: 889,054

[22] Filed: May 20, 1992

[51] Int. Cl.$^5$ ............... H03A 1/00; H04L 27/06
[52] U.S. Cl. ........................... 375/94; 379/59; 371/43
[58] Field of Search ............... 455/33.1; 375/39, 114, 375/94, 95; 379/59; 370/105.1, 110.1; 371/43

[56] References Cited

U.S. PATENT DOCUMENTS 5,199,031 3/1993 Dahlin ..................... 455/33.1

OTHER PUBLICATIONS

"An Efficient Maximum Likelihood Decoding Algorithm for Generalized Tail Biting Convolutional Codes Including Quasicyclic Codes" by: Qiang Wang and Vijay K. Bhargava, IEEE Transactions on communications, vol. 37, No. 8, Aug. 1989.

"On Tail Biting Convolutional Codes" by Howard H. Ma, 1986 IEEE.

*Primary Examiner*—Tesfaldet Bocure
*Attorney, Agent, or Firm*—Gordon R. Lindeen, III; William J. Streeter; Wanda K. Denson-Low

[57] ABSTRACT

A digital cellular system (10) employs a decoder that decodes control messages encoded by a convolutional tail-biting encoding procedure. The control messages (57) contain 65 bits that are encoded in a 260 bit data frame (59). The decoder reads (112) the first x quadruple bits and writes them also at the end of the data frame bit stream. A Viterbi decoding algorithm (114) is applied to the modified bit stream for x plus 65 steps. A bit stream of (65+x) bits is selected (116) from a best value path and y first bits are discarded from the selected stream. The output decoded message (118) includes bits (y+1) through (y+65).

16 Claims, 9 Drawing Sheets

SYSTEM AND METHOD FOR DECODING TAIL-BITING CODE ESPECIALLY APPLICABLE TO DIGITAL CELLULAR BASE STATIONS AND MOBILE UNITS

CROSS-REFERENCE TO RELATED APPLICATIONS—None.

BACKGROUND OF THE INVENTION

The present invention relates to digital cellular telephone systems and more particularly to decoders employed in such systems and other applications to decode messages convolutionally encoded by a technique called tail biting encoding.

Traditional cellular telephone systems have generally been based on the use of analog hardware for channel communication. In the analog system design, a single mobile phone is assigned to each assigned frequency in each cell.

More recently, digital cellular telephone systems have been and are being developed for commercial application. In the digital cellular system design, additional phone capacity is achieved by allocating multiple subscribers to each assigned frequency with the use of time-multiplexing techniques.

In implementing digital technology in the design of cellular telephone systems, competitive pressures make it especially immportant that design complexity be avoided or reduced with cost effectiveness while achieving quality product performance in accordance with applicable performance standards. Decoding of encoded messages is one product area where a need has existed for application of this design philosophy to achieve better and less expensive cellular mobile units and base stations.

In the North American Digital Cellular System, control messages are occasionally transmitted between the base station and a mobile unit. The control messages are called FACCH (Fast Associated Control CHannel) message and are convolutionally encoded for error protection, with use of a technique called tail-biting encoding. A FACCH word has a length L=65, the encoding rate is ¼, and 260 bits are accordingly output for each word. A tail-biting code differs from a zero tail code in that in the zero-tail code the first and last states are known, while, in a tail-biting code, the first and last states are the same, but they are unknown to the decoder.

Although there is ample literature on decoding convolutional codes, there is little literature on decoding tail biting codes. In one prior art scheme for decoding tail biting codes, three decoding methods are employed. In each of these methods, a Viterbi decoder is run several times, with a different starting state each time, until a final state is found that matches the starting state. The difference among these methods is in the choice of the starting state that will decrease the number of runs. The number of runs is still very high in each case and, as a result, these prior art methods are not practically implementable in real time software on a digital signal processor in a digital cellular unit. In another prior art decoding procedure for tail biting codes, numerous required runs also employ excessive CPU execution time.

Prior art decoders for tail biting codes have typically required special hardware circuitry for implementation of the complex decoding process, resulting in higher product costs as well as delay in product availability for the market. In general, such decoders have not been adaptable to lower cost software implementation and have been impractical for commercial application in cellular telephone and other systems.

The present invention is directed to providing improved and less costly decoding of messages, and especially control messages that are received in a cellular base or mobile unit in a digital cellular system.

SUMMARY OF THE INVENTION

A digital cellular system is provided for receiving and decoding B bit control messages each of which is encoded in an E bit data frame prior to transmission by a convolutional tail-biting encoding procedure. The receiving and decoding system comprises means for receiving and downconverting radio signals that carry the encoded control messages and means for demodulating data signals representing the encoded control messages from the downconverted radio signals.

Means are provided for decoding each input encoded message including means for modifying the stream of E data bits in the input data frame carrying the encoded message. The modifying means places a plurality of bits corresponding to x first quadruple bits in the stream of E bits in the message carrying data frame at the end of the bit stream. The decoding means further includes means for applying a Viterbi decoding algorithm to each modified data bit stream with predetermined starting states for a number of steps equal to B plus x.

Means are provided for selecting another bit stream having a number of bits equal to B plus x from a best value path generated by the algorithm. Means are provided for discarding y first bits from the other bit stream. Means are provided for generating an output decoded message equal to the remaining bits in the other bit stream from bit y+1 through bit y+B, and means are provided for processing each decoded control message to implement any command in the control message.

BRIEF DESCRIPTION OF THE DRAWINGS

The accompanying drawings, which are incorporated in and constitute a part of this specification, illustrate one embodiment of the invention and together with the description provide an explanation of the objects, advantages and principles of the invention. In the drawings.

DESCRIPTION OF THE PREFERRED EMBODIMENT

Figure 1:
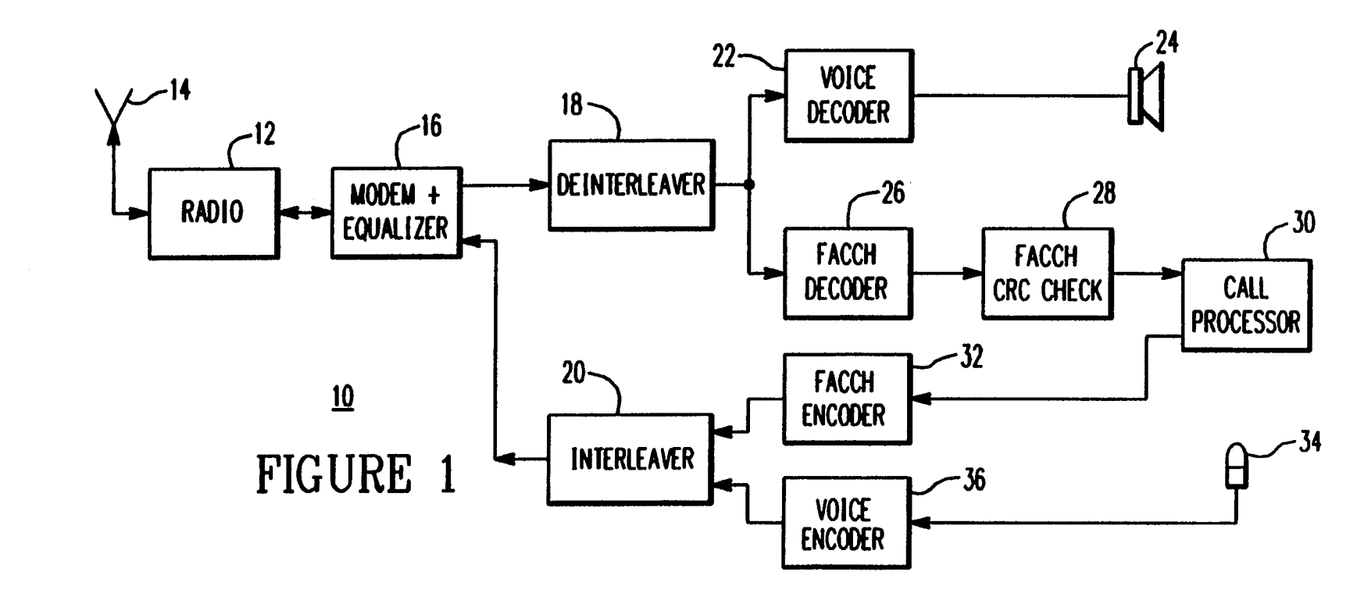
FIG. 1 shows a functional block diagram for a mobile digital cellular unit in which control messages are decoded in the digital mode in accordance with the present invention.

In FIG. 1, there is shown a digital/analog cellular mobile unit 10 that operates with tail-biting decoding in the digital mode to provide better and more cost effective unit operation in accordance with the present invention. The cellular mobile unit 10 can, for example, be a cellular telephone like the Hughes Network Systems M6100 Digital/Analog Cellular Telephone which is designed to facilitate industry transitioning from analog to digital communication.

The cellular unit 10 operates in its digital mode in the preferred embodiment of the invention. In the digital mode, greater sound clarity is achieved over conventional analog technology since background noise is eliminated and only actual voice is transmitted.

Radio signals are transmitted and received by conventional radio circuitry 12 through an antenna 14. Messages are modulated to produce a narrowband output for radio transmission or demodulated on reception by a modem and equalizer unit 16.

Equalization circuitry provides good receiver performance in a frequency-selective channel environment. Demodulated signals are applied to a deinterleaver 18 to extract one frame of voice or control from two received slots.

Encoded voice and control messages to be transmitted are applied to an interleaver 20 where the messages are interleaved and then applied to the modem 16 for modulation at the output broadband frequency. The modulated output is applied to the radio circuitry 12 where the output signal is upconverted to the RF level for transmission.

The general purpose of interleaving is to provide protection against an error in one transmission time frame from causing the loss of an entire block of voice or control data and also just to whiten error occurrences to improve decoder performance. To achieve this purpose, the interleaver 20 employs a matrix procedure to divide each data block between two successive time frames. Thus, each time frame includes data from two different, successive data blocks.

Received voice messages are decoded by a voice decoder and then reproduced by a speaker 24. Received control messages are decoded by a control message or FACCH decoder 26 in accordance with the present invention and then checked for errors by a CRC checker 28. Generally, the checker 28 performs a cyclic redundancy check by means of a bit pattern checking procedure similar to parity checking.

A call processor 30 initiates actions con, handed by valid decoded messages. The call processor 30 also generates control messages to be encoded for transmission to the base station. A conventional control message or FACCH encoder 32 employs tail-biting encoding to encode such control messages.

Spoken messages are received by a microphone 34 and encoded by a conventional voice encoder 36. The encoded control and voice messages are interleaved by the interleaver 20 for transmission through the antenna 14.

Figure 2A:
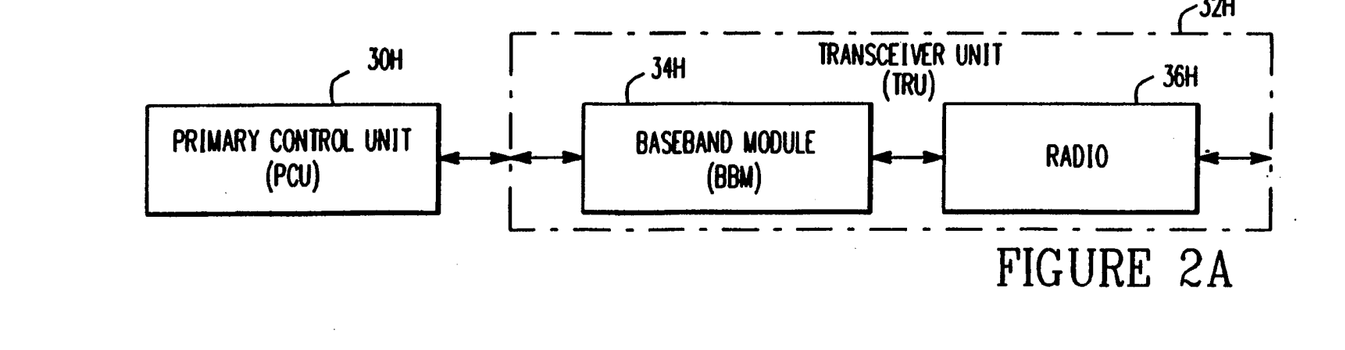
FIGS. 2A and 2B diagram basic hardware employed in the mobile cellular unit of FIG. 1.
Figure 2B:
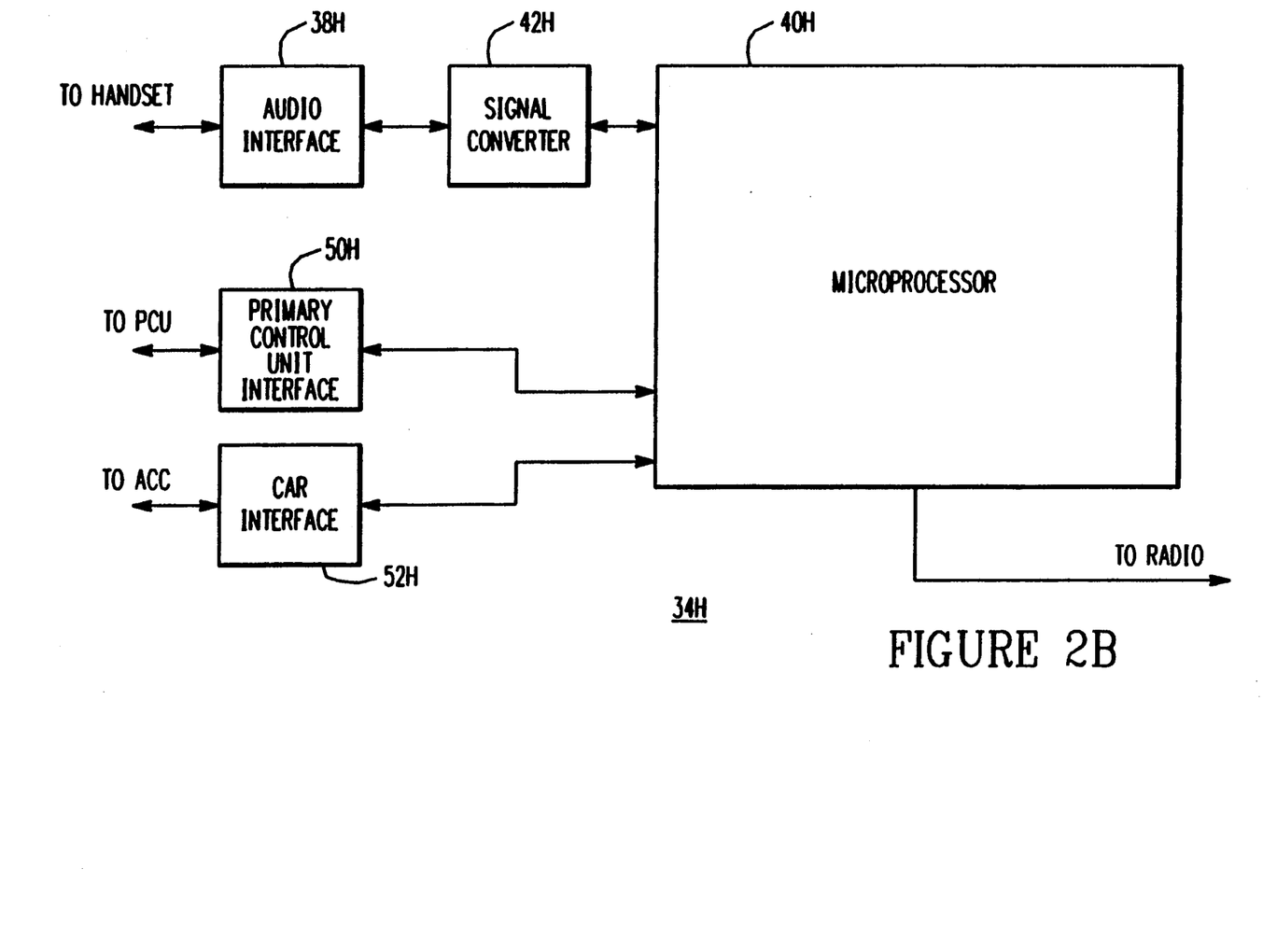

Basic hardware for the mobile unit 10 is shown in FIGS. 2A and 2B. A primary control unit 30H is provided for the mobile phone unit 10 and may, for example, be mounted on the front dash of a car. A transceiver unit 32H is electrically coupled to the primary control unit 30H and may be located, for example, in the trunk of the car. The transceiver unit 32H includes a baseband module 34H and a radio module 36H which is coupled to an antenna unit for transmission and reception of radio signals to and from the base station.

The baseband module 34H is illustrated in greater detail in FIG. 2B. Thus, a conventional audio interface 38H couples the baseband module 34H to a handset for the mobile unit 10. Audio signals are interfaced with a microprocessor system 40H through a signal converter 42H. The converter 42H converts incoming analog audio signals from the handset to digital signals for input to the microprocessor 40H, and it converts outgoing digital signals from the microprocessor 40H to analog audio signals for transmittal to the handset.

Generally, the microprocessor system 40H performs voice analysis, synthesis, and echo cancellation functions for processed audio signals. The microprocessor 40H also performs demodulation on a baseband frequency and performs decoding processing functions for incoming signals from the radio module 36H. In the transmission mode, the microprocessor 40H processes compressed and encoded voice data and generates filtered output data for radio output.

An interface 50H couples the microprocessor 40H and the primary control unit 30H. As shown, the microprocessor 40H is also coupled to the radio module 36H where inflow radio signals are downconverted to the baseband frequency and outflow baseband signals are upconverted to radio frequency for transmission.

A car interface 52H provides a coupling to a car accessories connection ACC that determines whether the mobile phone unit 10 operates only with the ignition on or with the ignition on or off.

Figure 3:
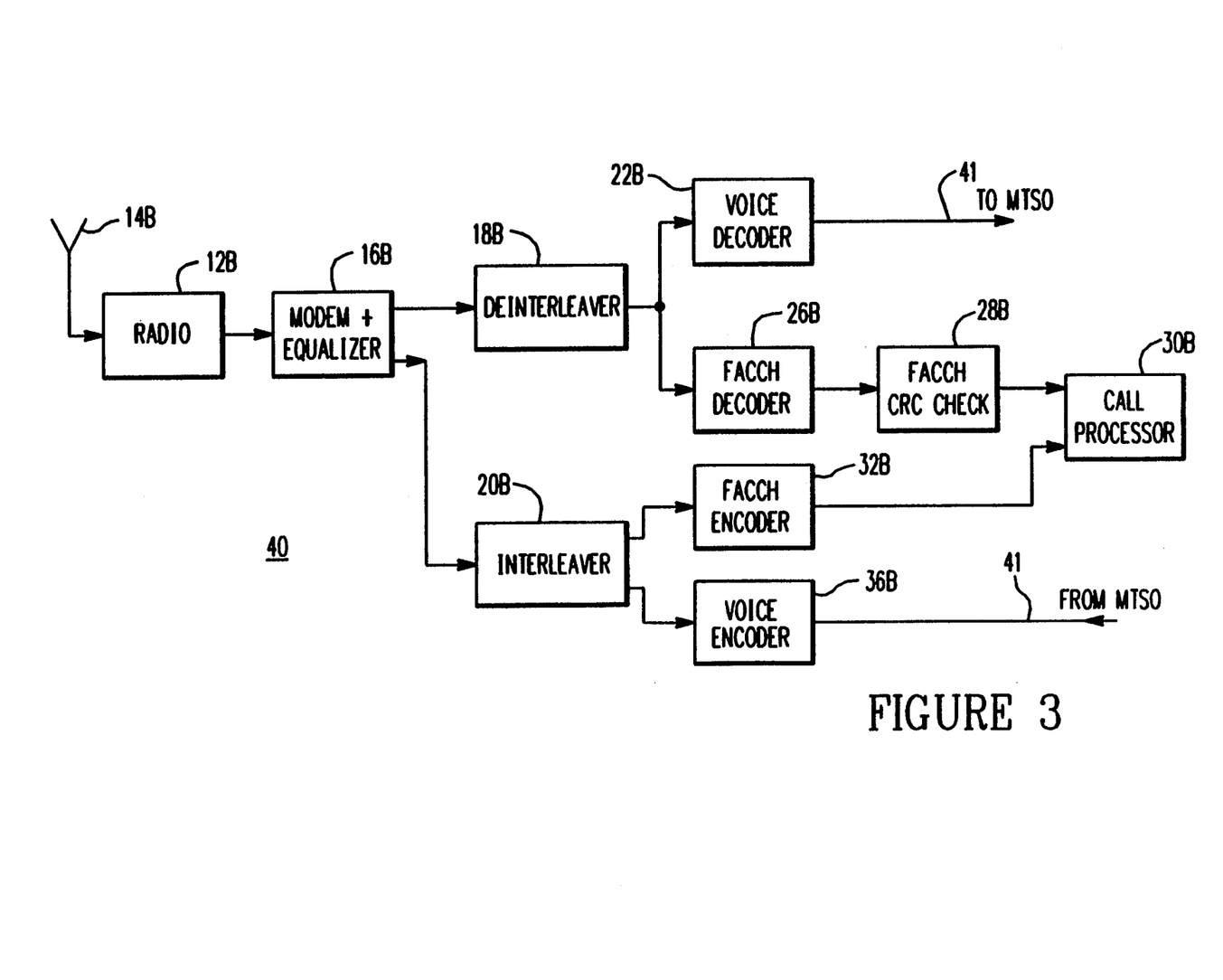
FIG. 3 shows a functional block diagram for a cellular base station in which control messages are decoded in the digital mode of operation in accordance with the present invention.

As shown in FIG. 3, a digital cellular base station 40 is functionally structured like the mobile unit 10 of FIG. 1. Accordingly, like reference characters, followed by a "B", are employed for like elements. However, the voice decoder and encoder blocks 22B and 36B are coupled to an MTSO 41 instead of speaker and microphone devices. The MTSO 41 is a switching center for the public telephone network.

CELLULAR CONTROL MESSAGES

Various control or FACCH messages are possible. For example, user issued control messages that command an action by a mobile unit during conversation include RELEASE, FLASH WITH INFO, SEND BURST DTMF, SEND CONTINUOUS DTMF, CHANGE PRIVACY MODE, AND CHANGE PREFERRED SERVICE. Messages transmitted from the base station also command mobile unit actions and include: ALERT WITH INFO, MEASUREMENT ORDER, STOP MEASUREMENT ORDER, HANDOFF, PHYSICAL LAYER CONTROL, RE-

LEASE, BASE STATION ACK, MAINTENANCE, AUDIT, ETC.

Figure 9A:
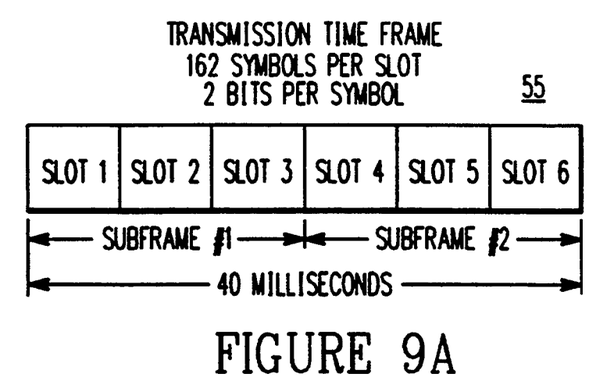
FIG. 9A diagrams a time frame within which voice and control data words are transmitted.
Figure 9B:
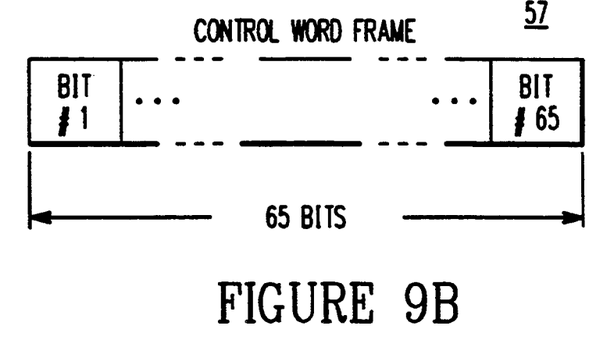
FIGS. 9B and 9C respectively diagram the general structure of a control data word and an encoded control data frame.
Figure 9C:
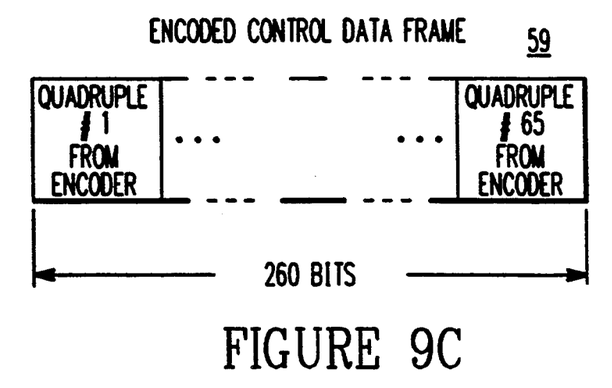

Control or FACCH words are 65 bits long prior to encoding, as shown in FIG. 9B. After encoding, as subsequently described more fully herein, a control word becomes encoded in a control data frame that is 260 bits long as shown in FIG. 9C. The control data frame is formed from 65 quadruples generated by the FACCH encoder.

The standard time frame for digital cellular transmission at a particular assigned frequency is diagramed in FIG. 9A. Thus, each time frame is 40 milliseconds long and is subdivided into two 20-millisecond subframes. In turn, each subframe is subdivided into three slots each of which is approximately 6.7 milliseconds long. Each slot contains 162 symbols, during each of which 2 bits are transmitted. Accordingly, each slot provides for transmitting 324 bits, which is equal to the 260 control (or voice) data bits plus 64 "overhead" bits.

CONTROL MESSAGE ENCODING

Figure 4:
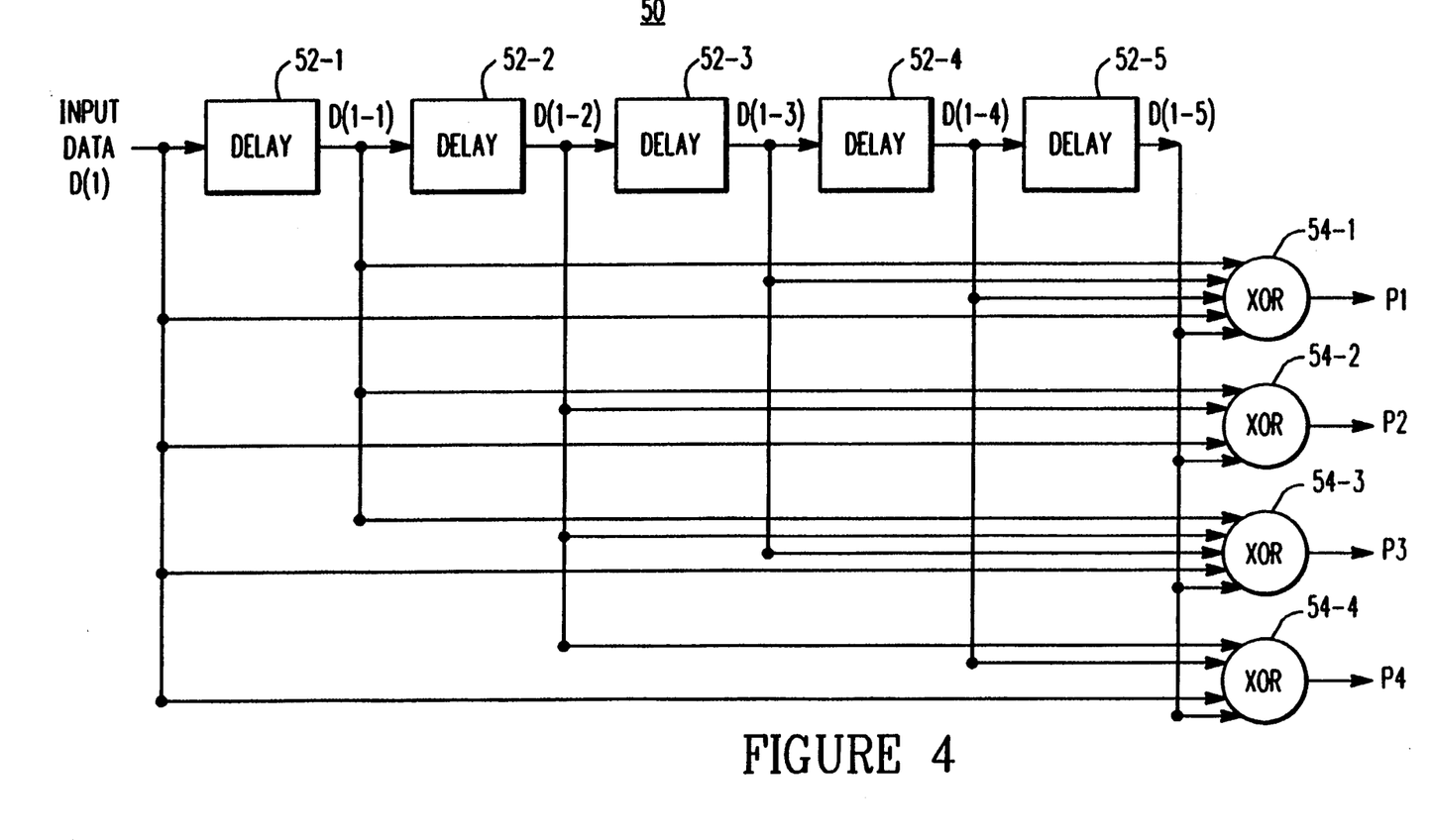
FIG. 4 shows a conventional convolutional coder for encoding control messages to be transmitted in cellular systems.

As previously indicated, control (FACCH) messages are encoded to protect against transmission errors and thereby enhance the quality of communication service. In FIG. 4, there is shown a conventional FACCH tail-biting-code encoder 50 that is employed in the preferred embodiment. The encoder 50 is preferably logically embodied in a programmed procedure executed by a mobile unit microprocessor or a base station microprocessor.

The tail-biting-code encoder 50 employs a shift register having five registers 52-1 through 52-5. Quadrature bit sets P1, P2, P3, P4 are generated after each of successive register shifts at output XOR gates 54-1 through 54-4.

The shift register is initialized with the first 6 bits of information from a control data word, D0 to D5, and a quadruple of encoded bits, P1, P2, P3 and P4 is output. New data bits are then shifted into the register from the control data word, with a new quadruple being output for each successive bit input and associated register shift. The last data bit from the control word is a bit D64 which is shifted into the register and followed by the first data bits D0 to D4. Thus, after one more shift, the encoder state will have returned to the starting state. The tail-end of the encoded data is immediately followed by the front end of the encoded data and hence is considered to be a "tail-biting" relationship.

A quadruple is defined as the data generated by an encoder corresponding to a single input bit. During decoding, the typical prior art Viterbi decoder considers each possible state of the encoder once per quadruple. The decoding process proceeds one quadruple at a time, and the quadruple under consideration at any particular instant is referred to as the current quadruple.

During the application of the Viterbi decoding process in a prior art decoder, each hypothesized state at any time has a sequence of predecessor states (corresponding to previous hypothesized transmitted data) which most closely correspond to possible required inputs to the transmitting encoder. These sets of state sequences (one per current state) can be viewed as paths through a trellis 51 (PRIOR ART FIG. 5), and are recorded by the decoder. The trellis 51 in FIG. 5 graphically illustrates decoder states along the vertical axis and decoding process steps along the horizontal axis. As shown, first and last portions of the trellis 15 are divergent, and a middle portion 49 of the trellis is a common path.

Figure 5:
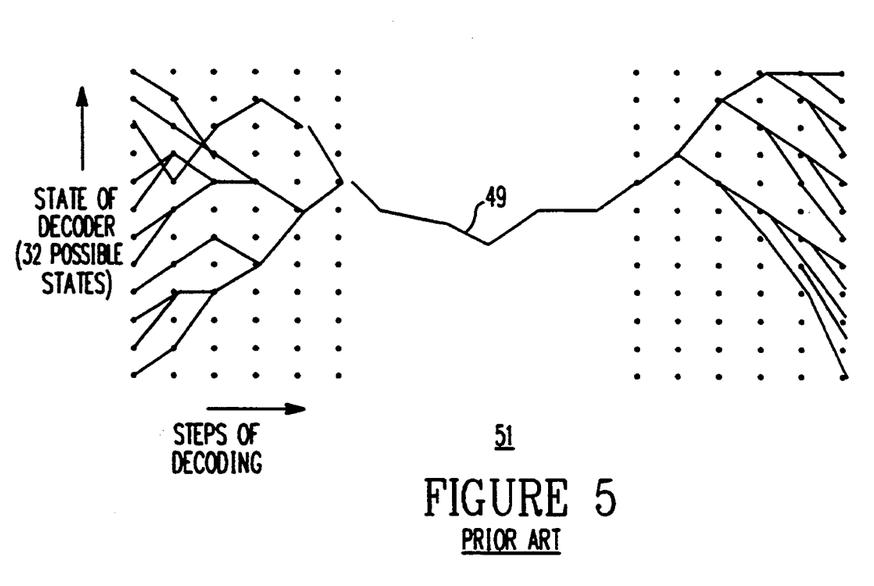
FIG. 5 is a schematic diagram for decoding paths in a prior art Viterbi decoding trellis.

With high probability, the sequence sets coincide to form a single path everywhere outside a window of a fixed number of symbols before the current symbol. If decoding begins at an unknown state, then the paths converge outside a similar window after the start.

Application of a 65-bit control message word 57 (FIG. 9B) to the encoder 50 results in an output of 65 quadruples that form a 260-bit control data frame 59 (FIG. 9C). In turn, the control data frame 59 is processed for transmission in a time slot within a time frame 55 (FIG. 9A) from the mobile unit to the base station or vice versa.

IMPROVED CELLULAR SYSTEM OPERATION WITH PROGRAMMED DECODING OF MESSAGES ENCODED WITH A TAIL-BITING-CODE

Figure 7:
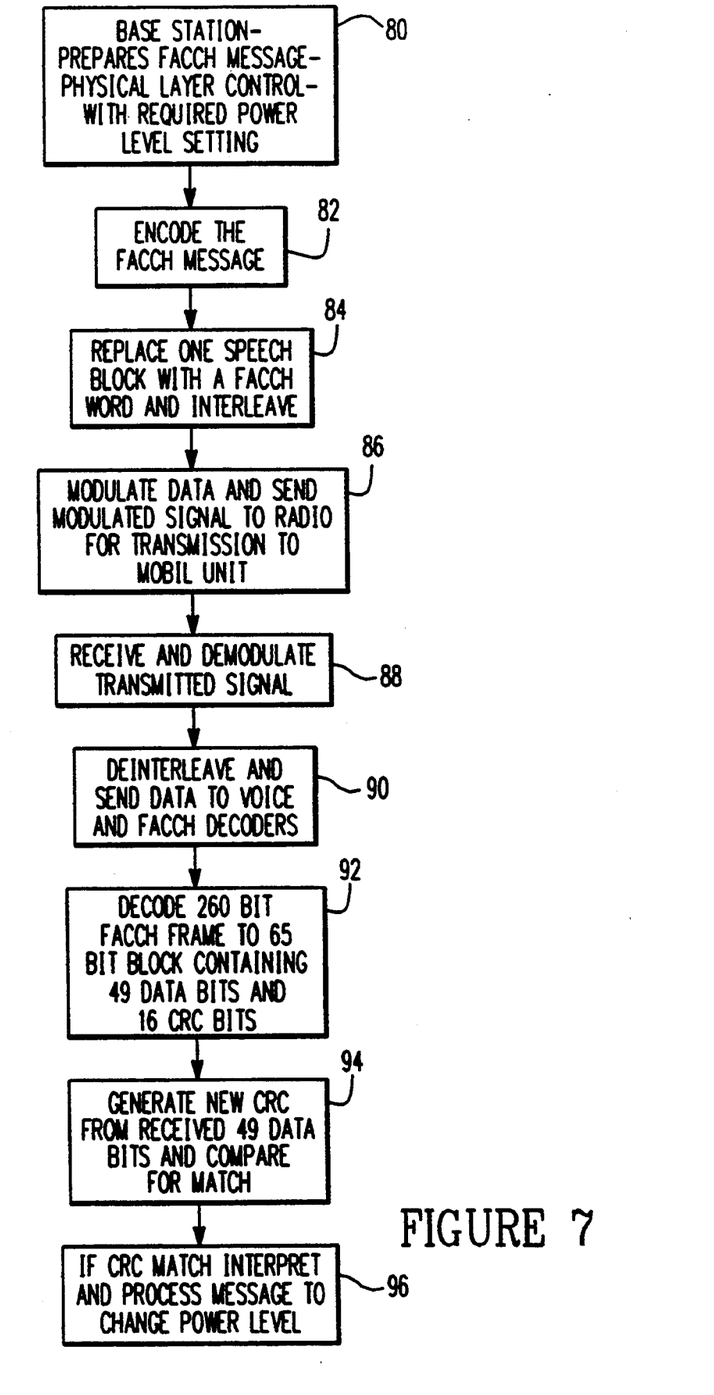
FIG. 7 illustrates a flow diagram for control message communication in a digital cellular system with message decoding provided in accordance with the present invention.

The overall operation of a cellular system in which tail-biting decoding is performed in accordance with the present invention is illustrated by a flow diagram for an exemplary control or FACCH message from the base station as shown in FIG. 7. The exemplary message is a PHYSICAL LAYER CONTROL that specifies a required power level setting for a mobile unit.

In a block 80, the message is prepared and sent to a block 82 for tail-biting-code encoding by the encoder 32B (FIG. 3) as described hereinabove. Next, interleaving is performed in a block 84 by the interleaver 20B as previously described.

In a block 86, outgoing data is modulated and the modulated signal is sent from the modem 16B to the radio 12B for processing and coupling to the antenna 14B. As indicated by a block 88 the radio signal is received by the mobile unit antenna 14 and processed for coupling to the modem 16 which demodulates the processed signal.

The demodulated signal is next deinterleaved by the deinterleaver 18 (FIG. 3) in a block 90 (FIG. 7) and the data is sent to both the voice and FACCH decoders 22 and 26 since at this point it is not known what kind of message data has been received. As indicated by block 92, the FACCH decoder 26 decodes an input 260-bit control word frame to a 65 bit block containing 49 data bits and 16 CRC bits as described more fully hereinafter. The tail-biting decoding performed in the block 92 is carried out in a way that enables cost effective software embodiment of the decoder while contributing to reliable and quality product performance.

In a block 94, CRC checking is performed as previously described. If a CRC match is found, the decoded control word should be equal to the transmitted control word, and the received control word (message) is interpreted and then processed in a block 96 to change the mobile unit power level in accordance with the message.

DECODING PROGRAM PROCEDURE

A decoding program procedure (FIG. 8) that is executed in the digital signal processor operates in accordance with the invention to provide improved and highly cost effective decoding of control messages encoded with a tail-biting-code.

Figure 8:
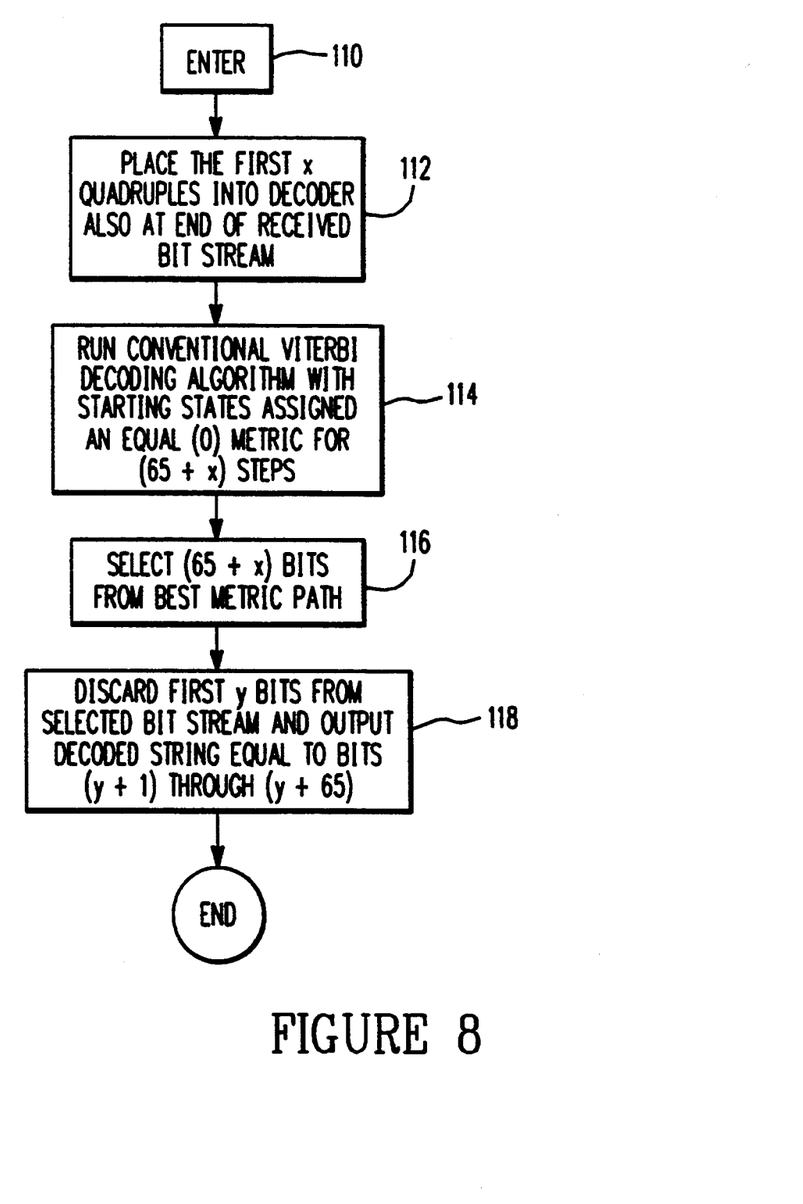
FIG. 8 shows a flow chart for a programmed procedure executed in a digital signal processor to decode tail-biting coded messages in the digital mobile cellular unit of FIG. 1 or the base station of FIG. 3.

After entry in block 110, a block 112 reads the first x quadruple bit sets of an E-bit control word frame, or in the preferred embodiment, a 260-bit control word frame, applied to the decoder 26 or 26B. The read bit sets are also placed as a "pseudo-tail" at the end of the bit stream received at the decoder input. Generally, it is preferred that x have a value within the range 2 to 100. In actual operation with real hardware, good product performance has been experienced with the variable x having a value of 31.

Next, a block 114 runs a conventional Viterbi decoding algorithm, with all starting states assigned an equal (0) metric for B+x steps, or in the preferred embodiment 65+31 or 96 steps (where B=65 and x=31). A block 116 next selects the Viterbi path with the best metric or value (i.e. the most likely path). The selected path provides an output string of 96 bits in the preferred embodiment.

In a block 118, the first y bits are discarded from the output string from the block 116. Accordingly, the output from the block 118 is a string of bits from y+1 through y+65.

In the preferred embodiment, the variable y has a value within the range 1 to 50; specifically, setting y equal to a value of 12 has provided good product performance. Thus, the final decoded string in the preferred embodiment consists of bits 13 through 77 in the best value or best metric output string from the block 116.

The Viterbi decoder gives the maximum likelihood path to each state in the trellis. If the Viterbi decoder is run on the received data for 65 steps and the best metric path is chosen, the first and last states will not match if the data is corrupted at the beginning or at the end of the stream.

However, the paths in the trellis tend to merge after a few steps of decoding and remain merged until a number of steps before the last state. In the present embodiment, for most error conditions, the paths merge well before y=12 steps, and remain merged until at least 15 steps before the last state.

Figure 6:
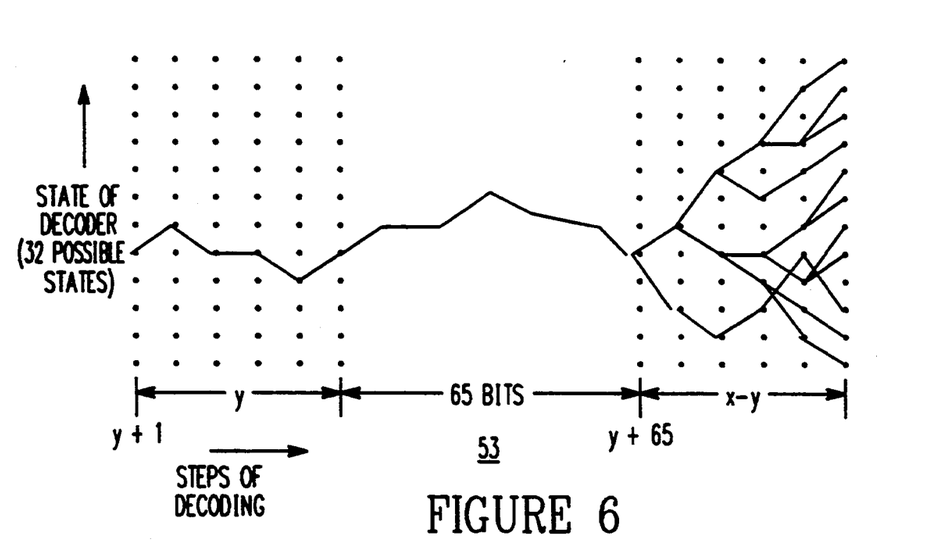
FIG. 6 is a schematic diagram for trellis decoding paths stored by a tail biting decoder employed in the unit of FIG. 1 or the base station of FIG. 3 in accordance with the present invention.

Thus, by adding the pseudo-tail in the program step 112, and running the decoder for 96 steps, the paths stored in the decoder are as shown by a trellis 53 in FIG. 6. In the trellis 53, path divergence occurs only after step (y+65) and the entire path from (y+1) through (y+65) is a common path.

Since all states start with zero metrics, the first bits in the lowest metric path are not well protected from errors. Thus, they are replaced by y bits (12 bits in the preferred embodiment) after step 65.

The decoder described hereinabove was implemented in software in accordance with the invention and tested on a TM5320C51 Digital Signal Processor, in a test dual mode subscriber unit. The following test results show that the unit meets the FACCH word error rate requirements specified in TIA IS-55:

TABLE

| FACCH ERROR RATE PERFORMANCE | | | |
|---|---|---|---|
| Simulated Vehicle Speed, km/h | CIR (db) | Max Allowable Word Error Rate | Measured Word Error Rate |
| 8 | 14 | 7.3% | 4.98% |
| 100 | 12 | 3.3% | 2.16% |

In operation, the test subscriber (mobile) unit provided decoding with use of about 20% of the CPU time of the TMS320C50 digital signal processor, which is the current state of the art in fixed point DSPs. Other known tail-biting decoding methods are more complex by orders of magnitude in comparison to decoding procedures implemented in accordance with the present invention. As such, such prior art decoding methods can not be practically implemented by software. Moreover, implementation of such prior art decoding methods with special circuitry makes the end product more expensive to manufacture and introduces delay in product introduction to the market.

Figure 10:
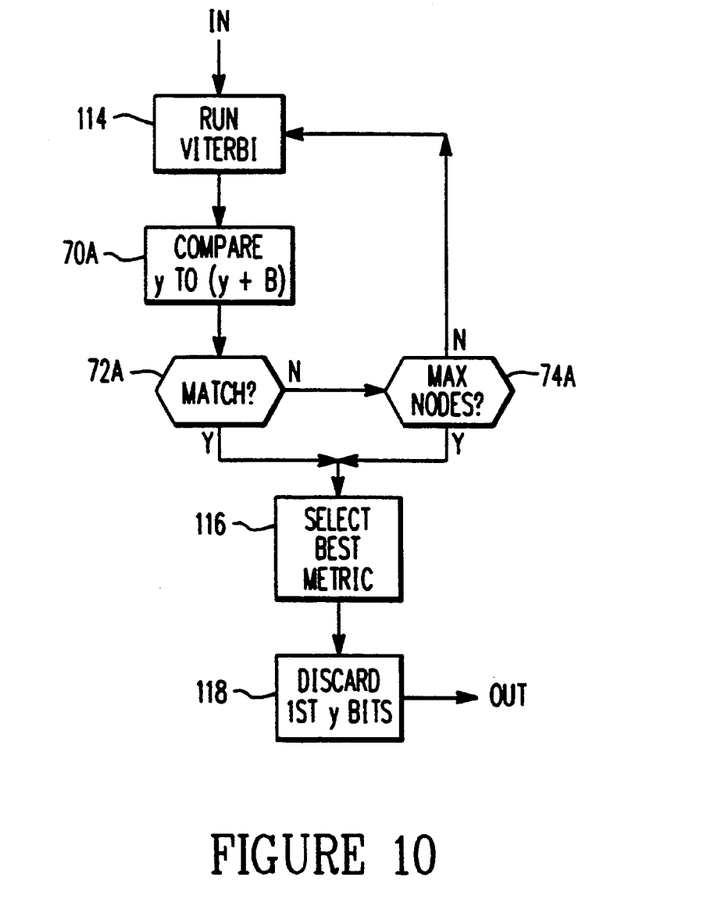
FIG. 10 shows a flow chart for an alternative decoding procedure in accordance with the invention.

In an alternative method of estimating the transmitted bit stream in accordance with the invention, as shown in the flow chart of FIG. 10, upon completion of (65+x) steps, state y is compared in a block 70A with state (65+y) on the path with the lowest metric. If test block 72A indicates these two states are identical, this lowest metric path is chosen and the decoding is complete. If the two states are not identical, decoding continues through test block 74A. At each node, the last state on the lowest-metric path is compared with the state 65 nodes earlier. Again, if the compared states are identical, the path is chosen; otherwise, decoding continues. This process is repeated, node by node, up to a predetermined point, at which the path with the lowest metric is chosen, even if the final state along that path does not match the state 65 nodes earlier.

The foregoing description of the preferred embodiment has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

What is claimed is:

1. A decoder for B bit control messages each of which is encoded in a stream of E data bits in a data frame prior to transmission by a convolutional tail-biting encoding procedure, said decoder comprising:
    means for modifying the stream of E data bits in the input data frame carrying the encoded message by placing a plurality of bits corresponding to x first quadruple bits in the stream of E bits in the message carrying data frame at the end of the stream of E bits;
    means for applying a Viterbi decoding algorithm to the modified stream of bits with predetermined starting states for a number of steps equal to B plus x;
    means for selecting another bit stream having a number of bits equal to B plus x from a best value path generated by said algorithm;
    means for discarding y first bits from said other bit stream; and
    means for generating an output decoded message having a number of bits equal to the remaining bits in said other bit stream from bit y+1 through bit y+B.

2. The decoder of claim 1 wherein B equals 65 and E equals 260.

3. The decoder of claim 2 wherein x has a value in the range 2 to 100.

4. The decoder of claim 2 wherein y has a value in the range 1 to 50.

5. The decoder of claim 4 wherein x has a value in the range 2 to 100.

6. The decoder of claim 5 wherein x equals 31.

7. The decoder of claim 5 wherein y equals 12.

8. The decoder of claim 7 wherein x equals 31.

9. The decoder of claim 1 further comprising means for receiving and downconverting radio signals that carry the encoded control messages, means for demodulating data signals representing the encoded control messages from the downconverted radio signals, and means for processing each decoded control message to implement commands in the control message and wherein the means for modifying modifies the demodulated data signals generated by the means for demodulating.

10. A system for decoding messages encoded in an E bit data frame prior to transmission by a convolutional tail-biting encoding procedure, said receiving and decoding system comprising:

means for decoding each input encoded message including means for modifying the stream of E data bits in the input data frame carrying the encoded message;

said modifying means placing a plurality of bits corresponding to x first quadruple bits in the stream of E bits in the message carrying data frame at the end of the bit stream;

said decoding means further including means for applying a Viterbi decoding algorithm to the modified stream of bits with predetermined starting states for a number of steps equal to B plus x;

means for selecting another bit stream having a number of bits equal to B plus x from a best value path generated by said algorithm;

means for discarding y first bits from said other bit stream; and means for generating an output decoded message having a number of bits equal to the remaining bits in said other bit stream from bit y+1 through bit y+B.

11. The system of claim 10 wherein B equals 65, E equals 260, and x has a value in the range 2 to 100.

12. The system of claim 11 wherein y has a value in the range 1 to 50.

13. A method for decoding B bit control messages each of which is encoded in an E bit data frame prior to transmission by a convolutional tail-biting encoding procedure, the steps of said method comprising:

modifying the stream of E data bits in the input data frame carrying the encoded message by placing a plurality of bits corresponding to x first quadruple bits in the stream of E bits in the message carrying data frame at the end of the bit stream;

applying a Viterbi decoding algorithm to the modified stream of bits with predetermined starting states for a number of steps equal to B plus x;

selecting another bit stream having a number of bits equal to B plus x from a best value path generated by the algorithm;

discarding y first bits from the other bit stream; and generating an output decoded message having a number of bits equal to the remaining bits in the other bit stream from bit y+1 through bit y+B.

14. The method of claim 13 wherein B equals 65, E equals 260, x has a value in the range 2 to 100 and y has a value in the range 1 to 50.

15. The method of claim 13 wherein the steps of said method further include:

comparing state y with state (y+B) in said other bit stream of the best value;

if no match is found in the comparing step repeating the decoding and comparing steps on said other bit stream to subsequent path nodes until a state match is obtained or until a predetermined number of nodes have been processed; and discarding the first y bits from said other bit stream after any comparing step for which states y and (y+B) match or after the predetermined number of nodes has been processed.

16. The method of claim 13 further comprising the steps of:

receiving and downconverting radio signals that carry the encoded control messages;

demodulating data signals representing the encoded control messages from the downconverted radio signals;

processing each decoded control message to implement commands in the control messages; and wherein the step of modifying comprises modifying the stream of E data bits in the input data frame by acting on the demodulated data signals generated in the step of demodulating.

* * * * *